United States Patent [19]

Takagi et al.

[11] Patent Number: 4,538,102
[45] Date of Patent: Aug. 27, 1985

[54] POWER SUPPLY CIRCUIT

[75] Inventors: Masayuki Takagi, Kawasaki; Hiroshi Mugiya, Tama; Shigeru Komaju, Sendai, all of Japan

[73] Assignee: Fujitsu Limited, Kawasaki, Japan

[21] Appl. No.: 529,637

[22] Filed: Sep. 6, 1983

[30] Foreign Application Priority Data

Sep. 10, 1982 [JP] Japan .................. 57-157700
Oct. 29, 1982 [JP] Japan .................. 57-172349

[51] Int. Cl.³ ............................................. G05F 1/48
[52] U.S. Cl. ................................... 323/349; 323/274
[58] Field of Search ............ 323/274, 276, 303, 349, 323/353; 307/231, 350, 355, 360, 362, 363; 328/132

[56] References Cited

U.S. PATENT DOCUMENTS 3,819,986  6/1974  Fukuoka ..................... 323/276

FOREIGN PATENT DOCUMENTS 658544  4/1979  U.S.S.R. ..................... 323/276

Primary Examiner—Peter S. Wong
Assistant Examiner—Judson Jones
Attorney, Agent, or Firm—Staas & Halsey

[57] ABSTRACT

A power supply circuit including a voltage stabilizing circuit and a voltage changing circuit responsive to an external control signal. The power supply circuit operates in one of two voltage-level changing modes. One mode changes the voltage level from a first stabilized output voltage to a second stabilized output voltage and the other mode cuts off or restores a stabilized output voltage.

14 Claims, 10 Drawing Figures

POWER SUPPLY CIRCUIT

BACKGROUND OF THE INVENTION

1. Field of the Invention

The present invention relates to a power supply circuit which can change its stabilized output voltage, in steps in response to an external control signal.

A power supply circuit in accordance with the present invention can be used, for example, for changing the voltage level applied to microwave amplifiers to change the amplification degree and for cutting off or restoring the stabilized output voltage applied to microwave amplifiers.

2. Description of the Prior Art

Stabilizing power supply circuits are used for a wide range of applications. In microwave applications, two stepped stabilized power supplies are required. The first power supply is used for changing the amplification of a microwave amplifier, to detect a malfunction in another microwave amplifier being operated in parallel. The second power supply is used for cutting off the stabilized power supply to a microwave amplifier when the amplifier is in an abnormal state and restoring the power supply when the amplifier returns to normal.

There are several ways to provide these two stabilized power supplies. A first approach is to provide two circuits, one having a higher output voltage and the other having a lower output voltage. As can be easily understood, this has the disadvantages of higher manufacturing cost, greater size, and requiring for a complicated switching circuit.

A second approach is to install parallel resistors in the circuit and switch these resistors in response to external conditions. This approach, however, has the disadvantages of a slight loss of stability in the output voltage during transition and the need for a complicated switching circuit.

A third approach is to use a variable resistor in the circuit and to vary the resistance by a manual or automatic changing device. However, this results in more complex operation and may entail the use of a complex device when automatic changing is desired.

SUMMARY OF THE INVENTION

An object of the present invention is to provide a power supply circuit which can provide two different stabilized voltages, in response to an external control signal, using a simple circuit.

In accordance with the present invention, there is provided a power supply circuit including an output transistor outputting a stabilized voltage and a control transistor controlling the base potential of the output transistor. An impedance device is connected to the base of the control transistor to which it applies a divided voltage. A switching device is turned on and off in response to an external control signal to vary the division ratio of the impedance device.

Another object of the present invention is to provide a power supply circuit which provides a stabilized voltage under one condition and cuts the stabilized voltage potential off under another condition.

According to the present invention, therefore, there is also provided a power supply circuit including a stabilized voltage output circuit having an output transistor stabilizing the voltage level and a thyristor device connected to the base of the output transistor. The thyristor device is triggered and conducts when a first control signal reaches a first predetermined value and a switching device is connected in series with the thyristor device and is turned on when a second control signal reaches a second predetermined value lower than the first predetermined value. The stabilized voltage is cut when the first control signal reaches the first predetermined value and the stabilized voltage is restored when the second control signal reaches the second predetermined value.

BRIEF DESCRIPTION OF THE DRAWINGS

Other objects and features of the present invention will be clear with reference to the accompanying drawings, wherein.

DESCRIPTION OF THE PREFERRED EMBODIMENTS

Figure 1:
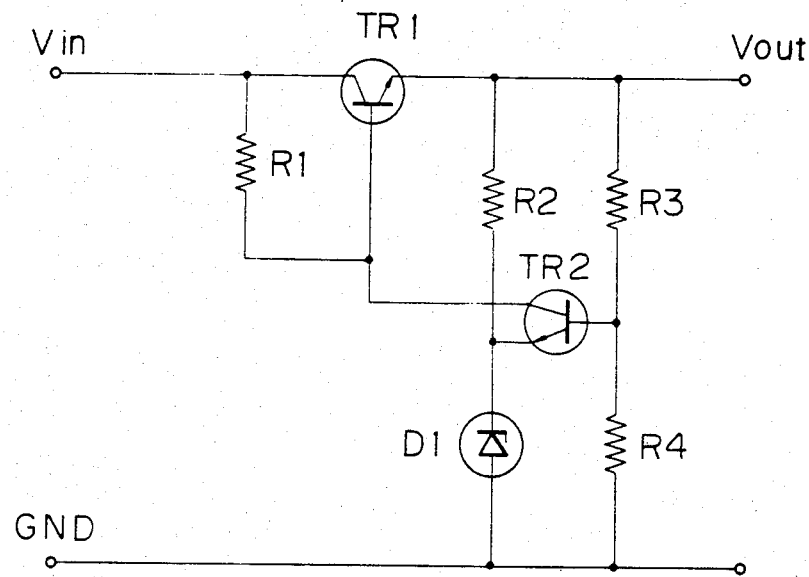
FIG. 1 is a circuit diagram of a prior art stabilizing power supply.

Before describing the preferred embodiment, a prior art stabilizing power supply circuit will be described for comparison. FIG. 1 is a circuit diagram of the prior art circuit. In FIG. 1, $V_{in}$ designates an input terminal, $V_{out}$ an output terminal, GND a ground terminal, TR1 and TR2 transistors, D1 a zener diode, and R1, R2, R3 and R4 resistors.

In the circuit of FIG. 1, when a positive voltage is applied between the input terminal $V_{in}$ and the ground terminal GND, as a result positive voltage is applied to base of the transistor TR1 through the resistor R1, and the transistor TR1 is turned on, thereby producing an output voltage at the output terminal $V_{out}$.

Series-connected resistors R3 and R4 are inserted between the output terminal $V_{out}$ and the ground terminal GND. At a junction point between resistors R3 and R4 is connected the base of the transistor TR2. The emitter of the transistor TR2 is connected to the zener diode D1 which generates a reference voltage, and the collector of TR2 is connected to the base of the transistor TR1. Therefore, the transistor TR2 becomes active when the voltage (potential) at the above junction point, i.e., the base potential of the transistor TR2, becomes greater than the emitter potential of the transistor TR2 (a predetermined value). When the transistor TR2 is fully turned on and its conductivity is increased, the base potential of the transistor TR1 is low and the conductivity of transistor TR1 is reduced, and therefore, the output voltage at the output terminal $V_{out}$ is maintained low.

On the other hand, when the potential between the base and the emitter of transistor TR2 is smaller than the predetermined value, the transistor TR2 is turned off. When the conductivity of the transistor TR2 is reduced, the base potential of its transistor TR1 becomes high and the conductivity is raised thus the output voltage at the output terminal $V_{out}$ is raised.

Figure 2:
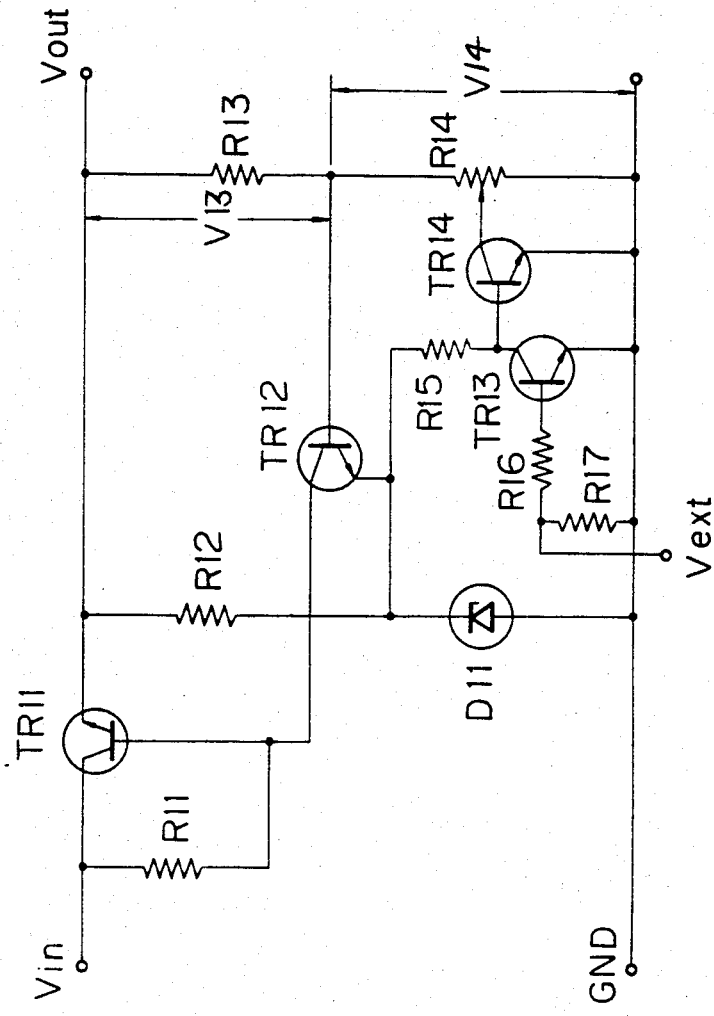
FIG. 2 is a circuit diagram of a stabilizing power supply circuit in accordance with an embodiment of the present invention.

FIG. 2 is a circuit a power supply circuit in accordance with an embodiment of the present invention. In FIG. 2, $V_{in}$ indicates an input terminal, $V_{out}$ an output terminal, GND a ground terminal, $V_{ext}$ an external control input terminal, TR11 to TR14 transistors and zener D11 a diode. Also indicated are R11 to its resistors, R14 a variable resistor, R15 to R17 resistors, V13 voltage potential across resistor R13, and V14 a voltage potential across resistor R14. The following relations exist:

$$V13:V14=R13:R14,$$

$$\therefore V13=V14(R13/R14).$$

$$V_{out}=V13+V14.$$

In this embodiment, the transistor TR14, whose collector is connected to a sliding terminal of the variable resistor R14, is turned on or off in response to a signal on the external control input terminal $V_{ext}$. The resistance between the base of the transistor TR12 and the ground terminal GND is therefore changed, and the voltage V2 to be compared with a reference voltage produced by the zener diode D11 is changed. Thus, the operating point of the transistor TR12 is changed. Thereafter, the voltage at the output terminal $V_{out}$ may be changed to the high level or low level.

The output voltage stabilizing operation in FIG. 2 is similar to that of the circuit in FIG. 1, so a detailed description will not be provided. Only the differences will be described below with reference to FIGS. 3(A) to 3(C).

Figure 3:
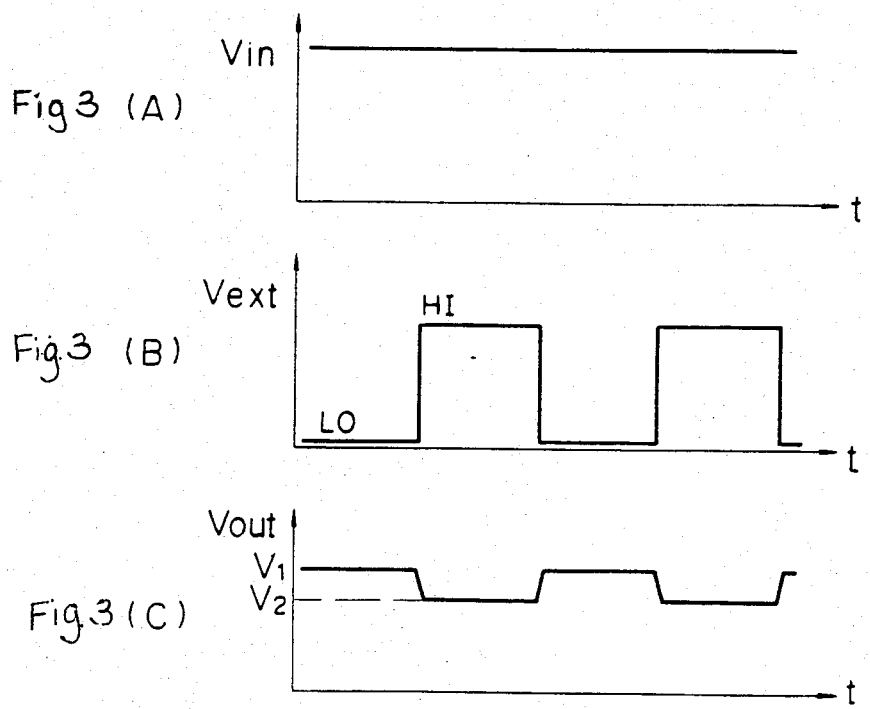
FIGS. 3(A) to 3(C) are signal timing charts of the circuit in FIG. 2.

FIG. 3(A) illustrates an input voltage ($V_{in}$) characteristic which is approximately constant independent of time (t). FIG. 3(B) illustrates two conditions of the signal on the external control input terminal $V_{ext}$, i.e., a logical low (LO) condition and a logical high (HI) condition. FIG. 3(C) illustrates the output voltage at the terminal $V_{out}$, which changes to high (V1) or low (V2) in response to the signal on the external control input terminal $V_{ext}$.

When the signal level on the external control input terminal $V_{ext}$ is zero (LO in FIG. 3(B)), the collector of the transistor TR13 has a high voltage applied through the resistor R15. However, the transistor TR13 is still off. The transistor TR14 is then turned on, and the variable resistor R14 is connected to the ground terminal GND via transistor TR14 and the sliding terminal, thereby providing a resistance which is smaller than entire resistance of variable resistor R14. Therefore, the circuit in FIG. 2 outputs a high-level stabilized voltage at the terminal $V_{out}$ (V1 in FIG. 3(C)).

On the other hand, when the signal level on the external control input terminal $V_{ext}$ is high (HI in FIG. 3(B)), the transistor TR13 is turned on and the transistor TR14 is turned off, and the resistance of the variable resistor R14 is at its maximum value. Therefore, the resultant output voltage at the terminal $V_{out}$ is a low stabilized voltage potential (V2 in FIG. 3(C)) smaller than the output voltage V out when the signal on the external control input terminal $V_{ext}$ is zero.

As mentioned above, the operating point of the transistor TR12, which controls the on and off state of the output transistor TR11 stabilizing the output voltage, can be changed by changing the resistance of the variable resistor R14 connected to the base of the transistor TR12. The change of the variable resistor R14 is effected by turning on and turning off the transistor TR14, whose collector is connected to the sliding terminal of the resistor R14, in response to the condition of the external control signal. Accordingly, the circuit shown in FIG. 2 outputs a high stabilized voltage or low stabilized voltage in response to the condition of the external control signal.

The high stabilized voltage and the low stabilized voltage are defined by suitably setting circuit parameters. In particular, the high stabilized voltage is defined by the position of the sliding terminal of the variable resistor R14.

Use of the circuit shown in FIG. 2 for a power supply of, for example, a microwave amplifier using a galium-arsenic field effect transistor, enables the output signal level of the microwave amplifier to be easily changed from high to low, and vice versa. Thus the amplification degree of the microwave amplifier can be easily changed just by changing the level of the external control signal.

Figure 4:
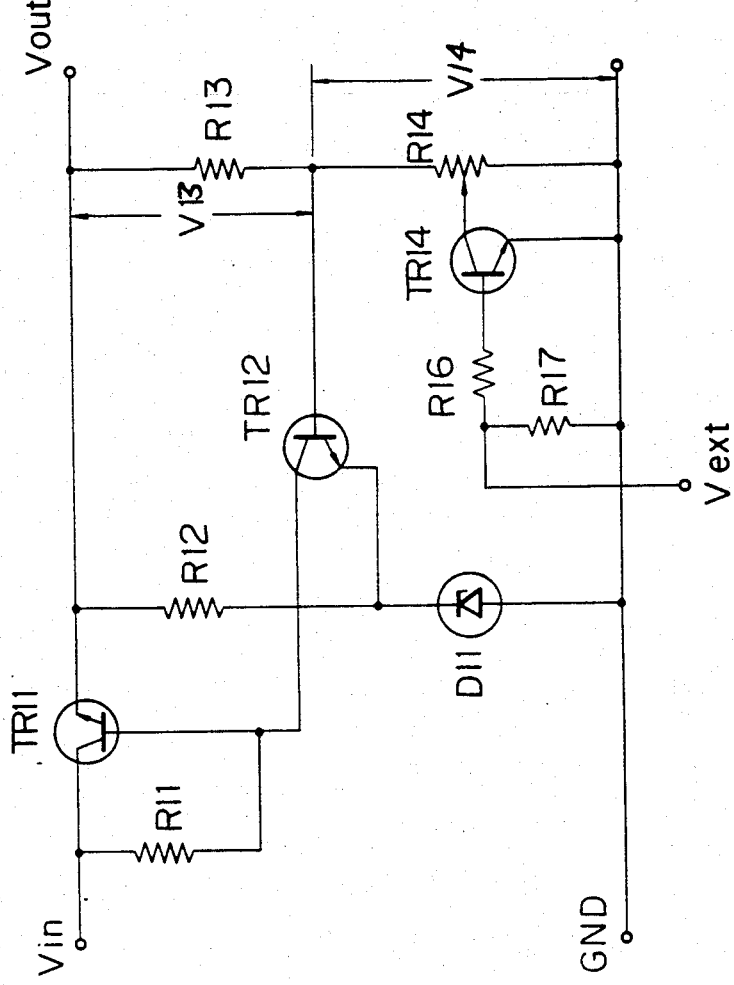
FIG. 4 is a circuit diagram of an alternative circuit corresponding to the circuit shown in FIG. 2.

FIG. 4 is a circuit diagram of a modified embodiment of the circuit shown in FIG. 2. As can be seen the circuit, in FIG. 4, responsive to the signal from the external control signal terminal $V_{ext}$ is simplified. The fundamental operation is similar to that of the circuit shown in FIG. 2, except that the effect of the polarity of the external control signal is opposite that of the circuit of FIG. 2.

Figure 5:
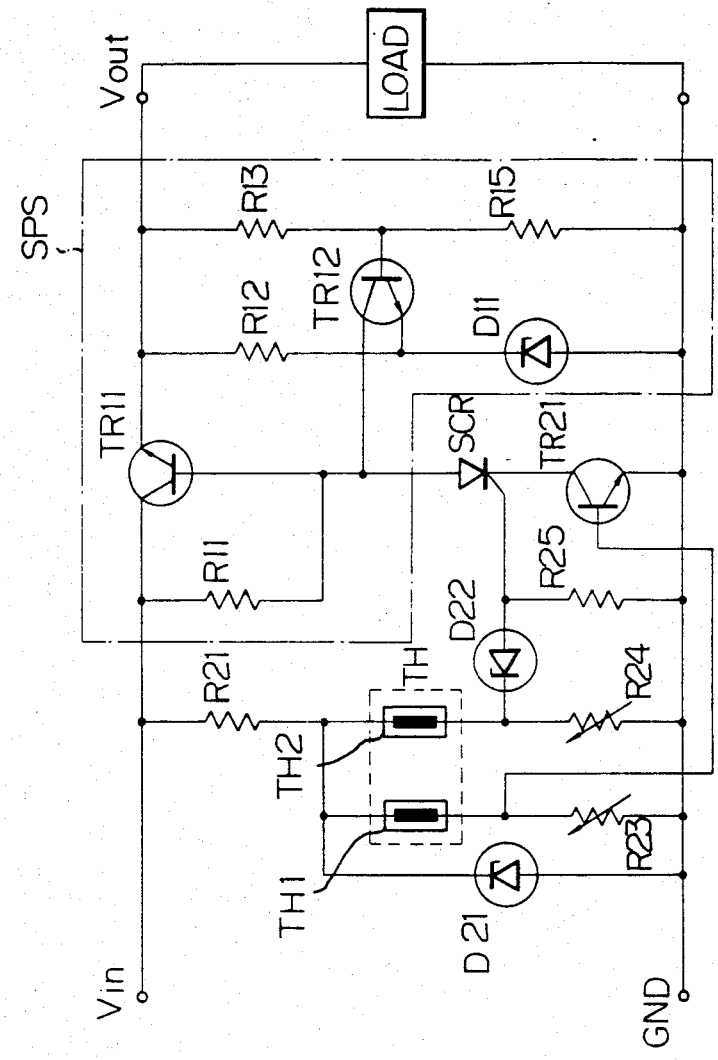
FIG. 5 is a circuit diagram of another embodiment in accordance with the present invention.

Another embodiment will be described below with reference to FIG. 5. In FIG. 5, $V_{in}$ represents an input terminal, $V_{out}$ represents an output terminal, and a stabilizing power supply or stabilized voltage outputting circuit SPS is similar to that in FIG. 2. The circuit in FIG. 5 further includes a thyristor SCR whose anode is connected to base of the transistor TR11 and a transistor TR21 whose collector is connected to the cathode of the thyristor SCR and whose emitter is connected to ground GND. Also included are a set of thermistors TH, incorporating a first thermistor TH1 and a second thermistor TH2. A zener diode D22 triggers the thyristor SCR in response to the second thermistor TH2 and a zener diode D21 defines the voltage between the thermister set TH and ground terminal GND. The circuit includes two variable resistors R23 and R24, and resistors R21 and R25.

The above circuit may, for example, be employed for a microwave amplifier as a stabilized power supply circuit which cuts off the power supply when the temperature detected by the thermistor set TH exceeds a predetermined value and which restores the power supply when the temperature falls below another predetermined value. In this case, the load in FIG. 5 corresponds to the microwave amplifier and the thermistor set TH is attached to the casing of the amplifier to detect the temperature of the amplifier.

Figure 6:
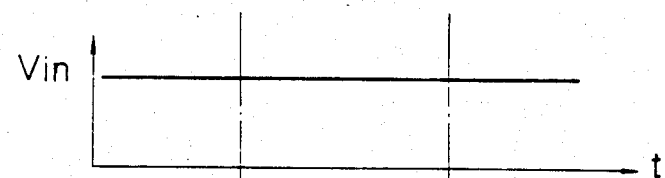
FIGS. 6(A) to 6(C) are signal timing charts of the circuit shown in FIG. 5.
Figure 6:
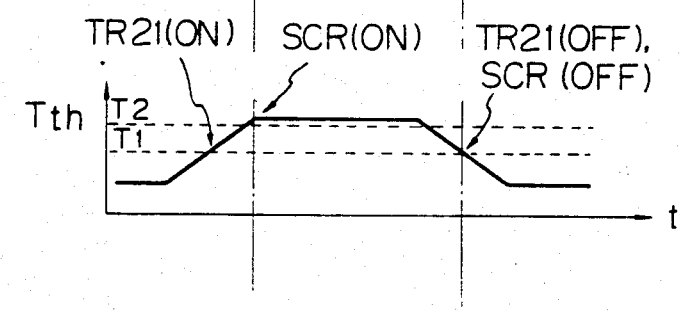
Figure 6:
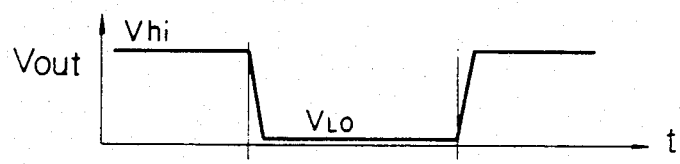

FIGS. 6(A) and 6(B) depict values involved in the operation of the circuit in FIG. 5. An approximately constant input voltage $V_{in}$ is applied between the terminal $V_{in}$ and ground terminal GND (FIG. 6(A)). In FIG. 6(B), a temperature T1 is defined as the threshold level at which the transistor TR21 turns on and off. In other words, the base potential of the transistor TR21 is determined by the temperature detected by the thermistor TH1 and the resistance of values TH1 and thermistor R23. The temperature T2 is defined as the trigger level for the thyristor SCR which makes it conductive. In this embodiment, the temperature T2 is higher than the temperature T1 at which the transistor TR21 starts conducting. This is essential to obtain a deadband characteristic and to turn the thyristor SCR off.

In the initial condition, the temperture in the casing of the amplifier is lower than T1 and a rated output voltage ($V_{hi}$ in FIG. 6(C)) is applied to the amplifier acting as the load. The thyristor SCR is thereby, inhibited, and the transistor TR21 is turned off.

When the temperature in the casing rises during operation, the resistance of the thermistor set TH is reduced. When the temperature in the casing reaches T1, the transistor TR21 is turned on due to the voltage at the junction point of the thermistor TH1 and the variable resistor R23. When the temperature in the casing further increases and exceeds T2 (FIG. 6(B)), the thyristor SCR is triggered due to the voltage at the junction point of the thermistor TH2 and the variable resistor R24. Therefore, the base potential of the transistor TR11 in the stabilizing power supply circuit SPS is reduced, the transistor TR11 is turned off and the microwave amplifier is cut off from the power source ($V_{LO}$ in FIG. 6(C)).

When the temperature falls below T1 and the power supply is cut off, the transistor TR21 is turned off, and the thyristor SCR is turned off and the transistor TR11 is turned on. Therefore, the power supply to the microwave amplifier is restored to the rated stabilized voltage level ($V_{hi}$ in FIG. 6(C)).

As described above, the circuit in FIG. 5 provides a rated stabilized voltage or a low level voltage, which is approximately zero, depending on the condition of the load. It should be noted that the above circuit has a deadband characteristic due to the thermister conditions. The circuit cuts off the power supply at a higher temperature $T_2$ than the temperature $T_1$ at which the power supply is restored.

While the present invention has been described in reference to the above embodiments, it is not limited thereto except as defined in the claims. For example, in FIG. 5, the thyristor SCR can be replaced by a triac. Also the thermistor can be replaced by another temperature sensor, such as a posistor (critical temperature resistor) which is a thermistor with a large positive temperature.

We claim:

1. A power supply circuit receiving an external control signal, comprising:
   an output transistor having a base and outputting a stabilized voltage;
   a control transistor, operatively connected to the base of said output transistor, having a base and controlling the base potential of said output transistor;
   impedance means, operatively connected to the base of said control transistor, for dividing the stabilized voltage and applying a divided voltage to the base of said control transistor; and
   switching means operatively connected to said impedance means and to receive the external control signal, for varying the division ratio of said impedance means.

2. A power supply circuit according to claim 1, wherein said impedance means comprises a variable resistor having a variable resistance terminal operatively connected to said switching means.

3. A power supply circuit according to claim 1, wherein said switching means comprises a switching transistor, operatively connected to said impedance means and to receive the external control signal, switching on and off in response to the external control signal.

4. A power supply circuit according to claim 1, wherein said switching means comprises:
   a first switching transistor, operatively connected to receive the external control signal, switching on and off in response to the external control signal; and
   a second switching transistor, operatively connected to said impedance means and said first switching transistor, for changing the division ratio of said impedance means in response to the switching of said first switching transistor.

5. A power supply circuit according to claim 2, wherein said switching means comprises a switching transistor, operatively connected to the variable resistance terminal of said variable resistor and to receive the external control signal, switching on and off in response to the external control signal.

6. A power supply circuit according to claim 2, wherein said switching means comprises:
   a first switching transistor, operatively connected to receive the external control signal, switching on and off in response to the external control signal; and
   a second switching transistor, operatively connected to the variable resistance terminal of said variable resistor and said first switching transistor, for changing the division ratio of said impedance means in response to the switching of said first switching transistor.

7. A power supply circuit receiving an input voltage, comprising:
   control signal means, operatively connected to receive the input voltage, for supplying first and second control signals;
   a stabilized voltage outputting circuit outputting a stabilized voltage, comprising an output transistor, operatively connected to receive the input voltage and having a base, said stabilized voltage outputting cirucit stabilizing the input voltage;
   thyristor means, operatively connected to said control signal means and the base of said output transistor, for conducting when the first control signal exceeds a first predetermined value; and
   switching means, operatively connected to said control signal means and in series with said thyristor means, for switching on when the second control signal exceeds a second predetermined value lower than the first predetermined value, and causing the stabilized voltage to drop from a prior level when the first control signal exceeds the first predetermined value and return to the prior level when the second control signal drops below the second predetermined value.

8. A power supply circuit according to claim 7, wherein said thristor means comprises a thyristor operatively connected to said output transistor, said control signal means and said switching means.

9. A power supply circuit according to claim 7, wherein said thyristor means comprises a triac operatively connected to said output transistor, said control signal means and said switching means.

10. A power supply circuit according to claim 8, wherein said switching means comprises a switching transistor operatively connected to said control signal means and said thyristor.

11. A power supply circuit according to claim 9, wherein said switching means comprises a switching transistor operatively connected to said control signal means and said triac.

12. A power supply circuit according to claim 7, wherein said control signal means comprises:

temperature detecting means, operatively connected to receive the input voltage, for detecting temperature; and a zener diode, operatively connected to said thyristor means and said temperature detecting means, providing the first predetermined value.

13. A power supply circuit according to claim 7, wherein said control signal means comprises:

temperature detecting means, operatively connected to receive the input voltage, for detecting temperature; and a zener diode, operatively connected to said thyristor means and said temperature detecting means, providing the second predetermined value.

14. A power supply circuit according to claim 7, wherein the stabilized voltage has a deadband characteristic, where the stabilized voltage drops from a prior level to approximately zero volts under the control of the first and second control signals.

* * * * *

UNITED STATES PATENT AND TRADEMARK OFFICE
CERTIFICATE OF CORRECTION

PATENT NO. : 4,538,102
DATED : August 27, 1985
INVENTOR(S) : Masayuki Takagi et al.

It is certified that error appears in the above-identified patent and that said Letters Patent is hereby corrected as shown below:

Col. 2, line 1, "value and a" should be --value. A--;
       line 41, after "result" insert --a--;
       line 41, after "to" insert --the--;
       line 66, "its" should be --the--;
       line 67, "the" should be --its--; first occurrence.
       line 67, after "raised" insert --,--.
Col. 3, line 1, after "circuit" insert --diagram of--;
       line 6, "zener D11 a" should be --D11 a zener--;
       line 6, "its" should be --R13 as--.
Col. 4, line 34, after "to" insert --the--;
       line 64, delete "of";

UNITED STATES PATENT AND TRADEMARK OFFICE
CERTIFICATE OF CORRECTION

PATENT NO. : 4,538,102        Page 2 of 2

DATED : August 27, 1985

INVENTOR(S) : Masayuki Takagi et al.

It is certified that error appears in the above-identified patent and that said Letters Patent is hereby corrected as shown below:

line 64, after "values" insert --of thermistor--;

line 64, "thermistor" should be --variable resistor--.

Col. 5,     line 42, after "temperature" insert --characteristic--;

line 56, after "means" insert --,--.

Signed and Sealed this

Fourth Day of March 1986

[SEAL]

Attest:

DONALD J. QUIGG

Attesting Officer        Commissioner of Patents and Trademarks